United States Patent [19]

Bercaw

[11] Patent Number: 4,963,291

[45] Date of Patent: Oct. 16, 1990

[54] INSULATING ELECTROMAGNETIC SHIELDING RESIN COMPOSITION

[76] Inventor: Robert M. Bercaw, Box 100, Rte. 3, Winona, Minn. 55987

[21] Appl. No.: 352,704

[22] Filed: May 10, 1989

Related U.S. Application Data

[63] Continuation-in-part of Ser. No. 206,252, Jun. 13, 1988, abandoned.

[51] Int. Cl.$^5$ .............................................. H01B 1/06
[52] U.S. Cl. ..................................... 252/512; 252/513; 252/514; 252/518; 252/519; 252/520; 252/521; 523/137; 523/457; 523/458; 523/459; 524/431; 524/430; 524/439; 524/440; 524/441; 524/401; 524/423; 524/425; 524/449; 331/84

[58] Field of Search ............... 252/512, 513, 514, 518, 252/519, 520, 521; 523/137, 457–459, 514, 516, 512, 521, 527; 336/233, 84 C, 84 M, 84 R; 524/423, 425, 448, 430, 445, 431, 435, 493, 436, 494, 437, 492, 441, 440, 449, 439

[56] References Cited

U.S. PATENT DOCUMENTS

| | | | |
|---|---|---|---|
| 4,113,981 | 9/1978 | Fujita et al. | 252/514 |
| 4,610,808 | 9/1986 | Kleiner | 252/512 |
| 4,696,764 | 9/1987 | Yamazaki | 252/512 |
| 4,880,570 | 11/1989 | Sanborn et al. | 252/512 |

*Primary Examiner*—Josephine Barr

[57] ABSTRACT

Filler blends of electroconductive particles with electrically non-conductive particles are provided which are useful in making electromagnetic shielding resins for encapsulating electronic devices.

10 Claims, No Drawings

INSULATING ELECTROMAGNETIC SHIELDING RESIN COMPOSITION

This application is a continuation-in-part of 07/206,252, filed 6-13-88, now abandoned.

This invention is directed to a filler blend for making electromagnetic shielding resins which are electrically non-conductive and which are particularly useful as coatings and encapsulants for surface mounted and axial leaded inductors. Specifically, the invention is directed to a filler blend of substantially spherical electroconductive particles and electrically non-conductive particles in selected size ranges and volume ratios such that when combined with an electrically non-conductive resin binder, provide an electrically non-conductive encapsulant or coating with electromagnetic shielding properties.

Certain electronic components require electromagnetic shielding to place them in close proximity to other components on printed circuit boards. However, such components must be electrically insulated from their surroundings including connecting leads and other conducting portions of the individual component which often must be electrically isolated from each other and cannot be in contact with any conducting material.

In most instances, shielding is now accomplished by a pressed iron shield which encompasses the device. This shield has to be electrically isolated from the device and other components in the circuit Such devices are relatively large in size and require additional processing steps to manufacture.

The compositions provided in the present invention allow for the encapsulation of inductors and other electronic components with a resin containing particulate electroconductive particles of substantially spherical cross-sections isolated from each other by electrically non-conductive particles of substantially spherical cross-section. The resin can be applied directly to the inductor device because it has acceptable electrical insulating characteristics at moderate to low voltages. The use of the filled resin in the manufacture of shielded devices has the net effect of reducing the size and weight of the shielded inductor package and permits their use in a more compact circuit.

It is therefore an object of the invention to provide a filler blend for making electromagnetic shielding resins which comprises (a) 8 to 55 percent by volume of electroconductive particles of substantially spherical cross-sectional dimension with average particle size ranging from 0.5 to 50 microns in diameter, and (b) electrically non-conductive particles of average particle size ranging from 0.005 to 2 microns in diameter.

It is a further object of the invention to provide for an electronic component packaging composition comprising a uniform mixture of a binder resin with from 30 to 80 percent by volume of a filler blend comprising (a) 8 to 55 percent by volume of electro-conductive particles of substantially spherical cross-sectional dimension with average particle size ranging from 0 5 to 50 microns in diameter, and (b) electrically non-conductive particles of average particle size ranging from 0.005 to 2 microns in diameter.

The invention also includes an electronic device shielded by an effective amount of the protective electronic shielding packaging resin.

As binder resins may be employed any electrically non-conductive thermoplastic or thermosetting resin which can be formulated with the electromagnetic filler blend without destroying the effective distribution of electromagnetic particles and insulator particles. Such resins may be in the form of catalyzed molding compounds, reaction injectable resins, and thermoplastic resins.

Binder resins may be selected from polyepoxides, polyesters, polyurethanes, polyisocyanurates, polyamides, polyethersulfones, polyimides, and mixtures thereof. Resins which are reaction injectable may be selected from ethylenically unsaturated polyesters, vinylesters, polyester urethanes, methyl methacrylate, vinylisocyanurates, polyurethanes, polyepoxies, nylons and blends thereof. Thermoplastic binders include polyacrylics, polystyrenes, polyvinyl chlorides, polyvinyl fluorides, polyethylene, polypropylene, and polytetrafluoroethylene resins. Silicone rubbers such as polydimethyl siloxane are also useful. Such resins when fully cured have a volume resistivity of at least $1 \times 10^{10}$ ohm-cms Representative polyepoxides are reaction products of diglycidyl ethers of bisphenol A or cresol novolacs with various diols, polyols, halogenated polyols and the like in the presence of a catalyst such as a boron trifluoride amine complex. Representative of such are those selected from "Kardura" E available from Shell Chemical Company which is a glycidyl ester produced by reacting epichlorohydrin and a mixture of saturated, highly branched mainly tertiary monocarboxylic acids having $C_9$, $C_{10}$ and $C_{11}$ chain lengths ("Versatic" acid): "Genepoxy" M205 which is a modified diglycidyl ether of bisphenol A, available from General Mills, Inc.: "Epon" 812, which is a diglycidyl ether of glycerol, available from Shell Chemical Company: "Epon" 826 which is a substantially pure diglycidyl ether of bisphenol A, also available from Shell Chemical Company; and "Epon" 828 which is a slightly resinified form of "Epon" 826, available from Shell Chemical Company. A preferred resin is derived from epichlorohydrin and cresol novolac precursors ECN-9860 available from Ciba-Geigy Co.

Also included are melamine formaldehyde resins which refer to those materials which are well known in the art and prepared by reacting melamine and formaldehyde. Modified melamine formaldehyde resins such as alkylated meamine formaldehyde resins include butylated melamine formaldehyde resins. Represented melamine formaldehyde resins which may be employed include, for example, such commercially available resins as "Cymel" 300, "Cymel" 301 and "Cymel" 303, all of which are available from American Cyanamide Company.

Polyesters are primarily polyesterification products of unsaturated dicarboxylic acids and polyhydric alcohols having 2-26 carbon atoms and at least 2 hydroxyl groups exemplified as polyols such as ethylene glycol, diethylene glycol, propylene glycol, dipropylene glycol, glycerol, pentaerythitol, sorbitol, mannitol, sorbitan, erythitol, bisphenol A and most preferably, alkoxylated derivatives of 2,2-di(4-hydroxyphenyl)propane having a range of 2-20 moles of ethylene oxide or propylene oxide per mole. The dicarboxylic acid may be unsaturated dicarboxylic acid such as fumaric and maleic, aromatic acids such as phthlatic, terephthalic, isophthalic or aliphatic dicarboxylic acids such as succinic, adipic, suberic, azelaic, sebacic, dimethyl succinate and halogenated derivatives of these acids such as tetrachloro phthalic acid. Polyester resins having a softening point in the range of 75°–120° C. have been found to be particularly useful in binder resins Polyisocyanuric resins are usually monomer solutions of isocyanurate based on toluene diisocyanate and hydroxypropyl methcrylate which are soluble in at least one of the following free radical polymerizable ethylenically unsaturated monomers such as divinyl benzene, styrene, methylacrylate, methyl methacrylate, ethylacrylate, ethyl methacrylate, 2-ethylhexyl acrylate, 2-ethylhexyl methacrylate, butylacrylate, butyl methacrylate, tetramethylene glycol diacrylate, trimethylol propane triacrylate, pentaerythitol triacrylate, neopentaglycol diacrylate, 1,3-butylene glycol diacrylate, 2,3-dibromo propylacrylate, 2,3-dibromo propylmethacrylate, cyclohexyl acrylate, cyclohexyl methacrylate, acrylic acid, methacrylic acid, hydroxyethyl acrylate, hydroxyethyl methacrylate, hydroxypropyl acrylate, hydroxypropyl methacrylate, chlorostyrene, acrylonitrile, vanillylidene chloride, vinyl acetate, vinyl stearate, vinyl toluene, hexane diol diacrylate, hexane diol dimethacrylate and mixtures thereof.

Reaction injectable molding processable polymers can be used as binder resins. For example, unsaturated polyesters, flame retardant unsaturated polyesters and polyurethanes are useful matrix material for electromagnetic shielding materials. Vinylisocyanurate, however, offers high temperature properties, corrosion resistance and dimensional stability. Vinylmaleate urethanes, flame retardant and corrosion resistant polyester resins (Atlac ® Resins) can also be used as binder matrix materials for the invention. In addition, the Derakane ® Vinylesters by Dow Chemicals can be employed. RIM processable epoxies, polymethylmethacrylate and the nylons are other candidates for matrix binder resins. Polymer alloys or blends are other classes of materials for the matrix material. For example, alloys of unsaturated polyesters/vinylesters and polyurethanes of various compositions can be given a range of properties as disclosed in Hutchinson U.S. Pat. No. 3,700,752.

Polyimide prepolymers which are reaction products of active methylene compounds with bismaleimides or diamines with maleic anhydride are useful per se or in combination with polysulfones or polyethersulfones. Suitable aromatic polyethersulfones as binder resins are those which are linear polymers containing three kinds of unit bonds consisting of an arylene bond, an ether bond and a sulfone bond. Such polyethersulfone resins are available under the trademark VICTREX ®, Imperial Chemical Industries.

The filler blend of the invention comprises substantially spherical electroconductive particles mixed with electrically non-conductive particles. These components may be blended together by dry mixing appropriate quantities of one or more of each type of particulate such that the usually larger electroconductive particle is surrounded by usually smaller sized non-conductive particles. Operable filler blends are made when the ratio of the average particle diameter of the electrically conductive particle to the average particle size of the non-conductive particles ranges from 20–60. The electroconductive particle size may range from 0.5–50 microns in diameter and are present in the blend in a range of 8–55% and preferably 14 to 55 percent by volume wherein the volume ratio of the non-conductive particles to the electroconductive particles ranges from 0.25–0.72. The average diameter of the non-conductive particles have an average particle size ranging from 0.005–2 microns and are present in the blend in amounts such that the volume ratio of the non-conductive particles to the electroconductive particles is greater than 0.25 but less than 0.72. A preferred ratio is about 0.3–0.4.

In preparing the filler blend of the invention, the particles may be mixed together dry by shaking, tumbling or ball-milling. In some instances, it is preferred to wet mix the combination in stabilized aqueous slurries or as a resin wetted paste which can be further mixed directly with the binder resin. In many instances, the particulate ingredients are pyrophoric and form explosive dust which must be handled with due caution. This problem is overcome by dry blending in an inert atmosphere.

As electroconductive particles it is preferred to employ particles having a size in the range of 2 to 15 microns. Such particles may be selected from iron, especially carbonyl iron such as that formed from the controlled thermal decomposition of iron pentacarbonyl gas in free space to produce spheres with a characteristic onion-skin structure due to minute carbon deposits in alternating layers. A particle material having average particle diameter of 4–6 microns is provided by General Aniline and Film Co. as GAF ® Type E. Additional materials made by this technique are provided as iron alloys with other transition metals. In addition, particulate materials may be selected from aluminum, copper, silver and steel and others selected from particles whose resistivity is less than $1 \times 10^2$ ohms. Electromagnetic oxide such as oxides of iron and chromium are also contemplated.

Non-conductive particles are defined as those with greater than $1 \times 10^8$ ohm resistivity. Representative non-conductive particles are silica in the form of mica, quartz, glass and other silicates such as calcium silicate, aluminum silicate, zirconium silicate and the like, alumina in the form of aluminum silicates, titanium dioxide and titanates such as barium titanate, carbonates such as calcium carbonate, sulfates such as calcium sulfate, oxides of iron such as ferric oxide and others such as lithium aluminum silicate, silicon carbide, magnesium silicate, zirconium oxide and other glass compositions such as microballoons. Organic compositions include particles of insoluble resins such as phenolic microballoons and the like. Such non-conductive particles are preferred to have a substantially spherical cross-section which includes spheres, rods, fibers and flakes.

The electromagnetic filler blend may be combined with above-described resin ingredients by dry mixing particulate and powdered resin, wet mixing through solvent deposition or by addition to polymerizing resins such as those used in reaction injection molding techniques. A preferred method is carried out when the filler resin is blended and intermixed with melted prepolymers below the curing temperature of the catalyst. Electronic components can be embedded in such filled resin at a temperature above the melting point and curing temperature. The filler blend can also be applied to liquid resin binders which are then spray coated or painted on the surface of electronic components.

A better understanding of the invention can be had by reference to the following non-limiting examples wherein all proportions expressed are by weight unless otherwise specified.

EXAMPLE 1

A 745 grams portion of iron powder having a average particle diameter of 4 to 6 microns (GAF® E) was manually dry blended by tumbling with a 70 gram portion of microsilica having an average cross-section of 0.5 microns with particles no greater than 1 micron (EMS 209 supplied by Elkem Chemicals Inc.). This powder filler blend was then shake mixed with powdered resinous ingredients having 114 grams of epoxidized cresol novolac resin (ECN9860 supplied by Ciga-Geigy), 50 grams of polyol derived from phenol formaldehyde novolac (RPMC2018A supplied by Ciba-Geigy), 10 grams brominated bisphenol A (BP4A supplied by Ciba-Geigy), 5 grams antimony trioxide, 1.1 grams 2-methylimidazole, 2.5 grams monoglycerol stearate and 2 grams carnauba wax. The powdered filler/binder resin blend was then compounded on a laboratory size two-roll hot/cold nip mill The cold roll was cooled at 25°-30° C. while the hot roll was heated to a temperature of 75°-98° C. The heated roll melted the resin to cause sufficient wetting of the dispersed particle filler blend. The hot roll running at a speed faster than the cold roll, produced sheer mixing as the ingredients passed between the nip. The formulation was passed through the rolls continuously until homogenously mixed, then removed as a sheet which was thereafter cooled to room temperature. The cold sheet material was then passed through a cold two-roll mill and ground to a uniform powder having a particle size of $-8/+40$ mesh (Tyler Sieve Series). The powdered material is then stored for further use in the manufacture of injection molded insulated electromagnetic shielded electronic components.

EXAMPLE 2

According to the procedure outlined in Example 1, 745 grams of iron powder, 65 grams Elkem 209 silica and 5 grams fumed silica (Cabosil® EH5) having an average particle diameter of 0.007 microns was dry blended and mixed with the resin blend of Example 1.

EXAMPLE 3

According to the procedure outlined in Example 1, the silica blend of Example 2 in different proportions as found in Table 1 was blended and tested.

The filled resin compositions of Examples 1, 2 and 3 were cast into 4 inch diameter square disks having a thickness of ⅛ inch and tested for volume resistivity, surface resistivity and dielectric strength. These electrical properties are listed in Table 1.

TABLE I

| INGREDIENTS | Examples 1-3 PARTS BY WEIGHT (gms) | | |
|---|---|---|---|
| | Ex 1 | Ex 2 | Ex 3 |
| RESIN | | | |
| Epoxidized Cresol Novolac (ECN9860) | 114 | 114 | 114 |
| Phenol Formaldehyde Novolac (RPMC2018A) | 50 | 50 | 50 |
| Brominated Polyol BP4A | 10 | 10 | 10 |
| Antimony Trioxide | 5 | 5 | 5 |
| 2-Methylimidazole | 1.1 | 1.1 | 1.1 |
| Monoglycerol stearate | 2.5 | 2.5 | 2.5 |
| Carnauba Wax | 2 | 2 | 2 |
| FILLER | | | |
| Iron Powder E | 745 | 745 | 745 |
| Silica (Elkem 209) | 70 | 65 | 60 |
| Silica (Cabosil EH5) | — | 5 | 10 |
| ELECTRICAL PROPERTIES | | | |
| Dielectric Strength S/T; ⅛" V/mil | | | |
| Disk 1 | 46 | 27 | 1.7 |
| Disk 2 | 31 | 28 | 24.8 |
| Disk 3 | 0 | 17 | — |
| Volume Resistivity (ohms-cms) | | | |
| Disk 1 | $1.5 \times 10^{14}$ | $1.9 \times 10^{15}$ | $1.4 \times 10^{15}$ |
| Disk 2 | $1.7 \times 10^{15}$ | $5.4 \times 10^{14}$ | $1.9 \times 10^{14}$ |
| Disk 3 | $2.1 \times 10^{15}$ | $2.3 \times 10^{14}$ | — |
| Surface Resistivity (ohms) | | | |
| Disk 1 | $6.9 \times 10^{13}$ | $1.6 \times 10^{13}$ | $6.9 \times 10^{14}$ |
| Disk 2 | $4.5 \times 10^{13}$ | $1.4 \times 10^{14}$ | $3.5 \times 10^{13}$ |
| Disk 3 | $5.7 \times 10^{13}$ | $6.5 \times 10^{13}$ | — |

EXAMPLE 4

A copper wire wound iron core axial leaded electromagnetic inductor measuring 1 mm by 1 cm. is placed into a mold and encapsulated with 0.33 mm of the composition of Example 1, then heated until fully cured. The performance of the inductor is similar to that having a conventional pressed iron shield.

What is claimed is:

1. A filler blend for making electromagnetic shielding resins which comprises,
   (a) 8-55 percent by volume of electroconductive particles of spherical crosssectional dimensions ranging from 0.5-50 microns having a resistivity less than $1 \times 10^2$ ohms, and
   (b) electrically non-conductive particles of spherical cross-sectional dimensions ranging from 0.005-2 microns having a resistivity greater than $1 \times 10^8$ ohms.

2. A filler blend of claim 1 which comprises
   (a) 14-55 percent by volume of electroconductive particles wherein the volume ratio of said non-conductive particles to said electroconductive particles ranges from 0.25-0.72.

3. A blend of claim 1 wherein said electroconductive particles are selected from the group consisting of iron, iron alloys, copper, aluminum, silver and electromagnetic oxides of iron and chromium.

4. A blend of claim 1 wherein said electrically non-conductive particles are selected from the group consisting of silica, mica, quartz, glass, calcium silicate, aluminum silicate, zirconium silicate, alumina, titanium dioxide, barium titanate, calcium carbonate, calcium sulfate, ferric oxide, lithium aluminum sulfate, magnesium silicate, zirconium oxide and insoluble resin beads.

5. A blend of claim 1 wherein said electroconductive particles are carbonyl iron and said non-conductive particles are silica.

6. A blend of claim 5 wherein said particles of iron ranges from 2 to 15 microns and said silica ranges from 0.005-1 microns in cross-section 7. A blend of claim 6 wherein the volume ratio of silica to carbonyl iron ranges from 0.3-0.4.

8. A molding composition comprising a uniform mixture of a filler blend of claim 1 with an electrically non-conductive binder resin selected from the group consisting of thermoplastic and thermosetting polymers having a volume resistivity of at least $1 \times 10^{10}$ ohms-centimeters wherein the volume of said filler in said resin is 30-80 percent by weight.

9. A composition of claim 8 wherein said binder resin is selected from the group consisting of polyepoxides, polyamides, polyimides, polyesters, polyethersulfone, polyetherether ketone, and blends thereof.

10. An electromagnetic inductor having an effective amount of the protective electronic shielding resin coating of a cured molding composition of claim 8.

* * * * *